United States Patent [19]
De Boer

[11] Patent Number: 5,498,914
[45] Date of Patent: Mar. 12, 1996

[54] CAPACITIVE SENSOR CIRCUIT

[75] Inventor: Jan R. De Boer, Drachten, Netherlands

[73] Assignee: U.S. Philips Corporation, New York, N.Y.

[21] Appl. No.: 269,795

[22] Filed: Jun. 30, 1994

[30] Foreign Application Priority Data

Jul. 1, 1993 [BE] Belgium ................... 09300680

[51] Int. Cl.⁶ ................................. H01H 36/00
[52] U.S. Cl. ........................... 307/116; 361/181
[58] Field of Search ............. 307/116; 361/181; 33/366; 324/680

[56] References Cited

U.S. PATENT DOCUMENTS

| | | | |
|---|---|---|---|
| 4,850,386 | 7/1989 | Bireley | 137/78.3 |
| 5,238,369 | 8/1993 | Farr | 417/18 |
| 5,367,198 | 11/1994 | Buergel et al. | 307/116 |

FOREIGN PATENT DOCUMENTS 0524708  1/1993  European Pat. Off. .

Primary Examiner—William M. Shoop, Jr.
Assistant Examiner—Albert Paladini
Attorney, Agent, or Firm—Ernestine C. Bartlett

[57] ABSTRACT

A capacitive sensor circuit is provided which comprises: a sensor electrode (16) forming a first plate of a sensing capacitor (14) relative to a reference terminal (10), a first (2) and a second (26) inverting Schmitt trigger having the same threshold voltages. A feedback resistor (8) provides feedback from the output (6) to the input (4) of the first trigger (2), which together with the sensing capacitor (14) forms an oscillator whose frequency depends on the magnitude of the sensing capacitor (14). The input (24) of the second trigger (26) is connected to the output of the first trigger (2) via a series resistor (22) and to the reference terminal (10) via a reference capacitor (30). The resistance values of the feedback resistor (8) and the series resistor (22) are equal. A d.c. signal will appear on the output (32) of the second trigger if the capacitance of the sensing capacitor (14) is smaller than the capacitance of the reference capacitor (30) and an a.c. signal in the opposite case.

10 Claims, 3 Drawing Sheets

CAPACITIVE SENSOR CIRCUIT

BACKGROUND OF THE INVENTION

The invention relates to a capacitive sensor circuit comprising: a sensor electrode forming a first plate of a sensing capacitor; a first inverting amplifier, having an input connected to the sensor electrode and having an output; a second amplifier, having an input coupled to the output of the first inverting amplifier and having an output; a feedback resistor connected between the output and the input of the first inverting amplifier.

Such a sensor circuit is known from European Patent Application No. EP 0,524,708, where the circuit is used to turn on a personal-care apparatus when it is lifted by the user of the apparatus and to turn off the apparatus when the apparatus is put down. The sensor electrode, the first inverting amplifier and the feedback resistor form an oscillator, also referred to as an astable multivibrator, whose oscillation frequency is dictated inter alia by the value of the feedback resistor and by the magnitude of the capacitance between the sensor electrode and the signal earth terminal of the capacitive sensor circuit. The oscillation frequency decreases as the capacitance increases. When the user picks up the apparatus the capacitance relative to earth is comparatively high and the frequency is comparatively low. If the apparatus has been put down the capacitance relative to earth is comparatively low and the frequency is comparatively high. The frequency difference or the frequency ratio between the comparatively low and the comparatively high oscillator frequency is measured by means of a frequency-to-voltage converter and is converted into a voltage difference, which energizes a switch to turn on the apparatus. The second amplifier then serves as a buffer between the oscillating first inverting amplifier and the frequency-to-voltage converter. This known capacitive sensor circuit is fairly susceptible to spreads in properties and values of the components used. It is known, inter alia from European Patent Specification EP 0,104,422, to compare the oscillation frequency with that of a second oscillator which comprises a reference capacitance relative to earth. The capacitance of the sensor electrode is compared with the capacitance of the reference capacitor by means of a frequency measurement. A gate circuit provides a signal which is a measure of the oscillation frequencies. This known solution can be accurate but requires the use of a gate circuit or some other coincidence circuit.

SUMMARY OF THE INVENTION

An object of the invention, to provide a capacitive sensor circuit which is accurate but does not require such a coincidence circuit, so that it is possible to save components.

To this end, according to the invention, a capacitive sensor circuit of the type defined in the opening paragraph is characterized in that a series resistor is connected between the output of the first inverting amplifier and the input of the second amplifier, which series resistor has a resistance value substantially equal to the resistance value of the feedback resistor; a reference capacitor is connected between the input of the second amplifier and a reference terminal, which reference capacitor has a capacitance value substantially equal to a predetermined value of the capacitance of the capacitive sensor electrode relative to the reference terminal; and in that the first inverting amplifier and the second amplifier are constructed as Schmitt triggers having substantially the same low and high input threshold voltages.

By means of these steps it is achieved that a d.c. level appears on the output of the second amplifier when the capacitance of the sensor electrode is smaller than the reference capacitance and that an alternating voltage of the same frequency as the oscillating first inverting amplifier appears on the output of the second amplifier in the opposite case. The change from direct voltage to alternating voltage is hardly susceptible to tolerances and can be detected reliably by means of a frequency-to-voltage converter, which converter now merely serves to detect whether a signal is a direct voltage of zero frequency or an alternating voltage of non-zero frequency. In order to minimize the influence of component spreads the first and the second amplifier are preferably identical NAND Schmitt triggers accommodated in one semiconductor body.

The capacitive sensor circuit is suitable for turning on and turning off all kinds of electrical apparatus having a handle, such as electric toothbrushes, shavers, irons, hair driers, drills, vacuum cleaners, and for turning on and turning off electrical equipment having touch controls, such as audio and video equipment, ovens, cook-tops and the like.

BRIEF DESCRIPTION OF THE DRAWING

These and other aspects of the invention will now be described and elucidated with reference to the accompanying drawings, in which.

In these Figures parts having the same function or purpose bear the same reference numerals.

DETAILED DESCRIPTION OF THE PREFERRED EMBODIMENTS

Figure 1:
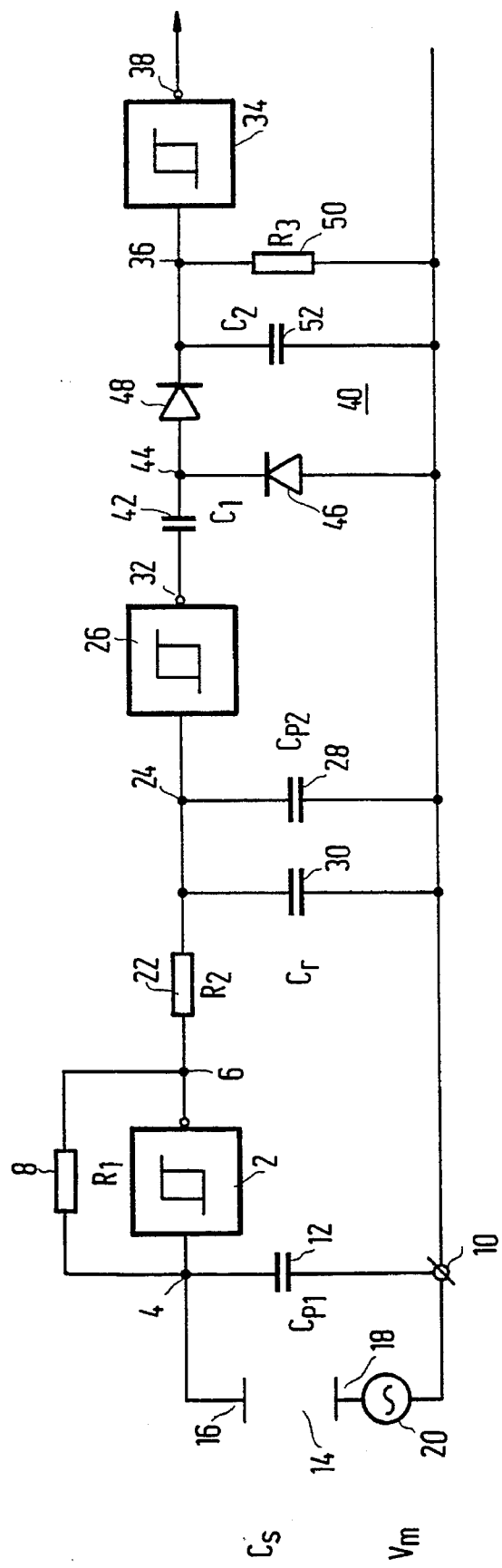
FIG. 1 shows a circuit diagram of a capacitive sensor circuit in accordance with the invention.

FIG. 1 shows a capacitive sensor circuit in accordance with the invention. A first inverting amplifier 2, in the form of a Schmitt trigger, has its input 4 connected to its output 6 via a feedback resistor 8. Two capacitors are situated between the input 4 and a reference terminal 10, which functions as signal earth for the sensor circuit. A first capacitor is formed by a parasitic input capacitor 12 having a value $C_{p1}$ and a second capacitor is formed by the capacitance $C_s$ of a sensing capacitor 14, having a first plate formed by a sensor electrode 16 connected to the input 4. The second plate is formed by the reference terminal 10 which, if desired, may also be connected to a second sensor electrode 18. For mains-powered apparatus having a handle it is adequate to build only the sensor electrode 16 into the handle. The reference terminal 10 is then coupled to the mains earth via the power supply of the sensor circuit. The capacitance $C_s$ relative to earth changes when the user takes hold of the handle. Now it is also possible to detect a hum voltage $V_m$ of mains frequency, which hum voltage is symbolized by an alternating voltage source 20 between the second sensor electrode 18, if present, and the reference terminal 10. The inverting amplifier 2, the feedback resistor 8 and the two capacitors 12 and 14 form an oscillator whose oscillation frequency $F_s$ decreases as the overall capacitance $C_{p1}+C_{p2}$ of the capacitors 12 and 14 increases. In the afore-mentioned apparatus with a sensor electrode 16 in the handle the oscillation frequency $F_s$ will be comparatively low if the apparatus is held by the handle and it will be comparatively high if the apparatus is put aside. When the detected hum voltage $V_m$ is very high there will no longer be a free oscillation and the oscillation frequency $F_s$ will be pulled to the mains frequency. The output of the first inverting amplifier 2 is connected to the input 24 of a second inverting amplifier 26, also formed by a Schmitt trigger, via a series resistor 22. The input 24 is connected to the reference terminal 10 via a parasitic capacitor 28 of a value $C_{p2}$ and a reference capacitor 30 of a value $C_r$.

In order to simplify a rough calculation of the oscillation frequency $F_s$ it will be assumed, although this is not essential for the operation of the capacitive sensor circuit, that the average value of the low threshold voltage $V_l$ and the high threshold voltage $V_h$ lies halfway the supply voltage $V_{cc}$ and that their difference voltage is $V_n$:

$$V_h = \tfrac{1}{2} * (V_{cc} + V_n); \quad V_l = \tfrac{1}{2} * (V_{cc} - V_n) \tag{1}$$

During oscillation the voltage $V(t)$ across the overall capacitance at the input 4 will vary between the low threshold voltage $V_l$ and the high threshold voltage $V_h$ within one period T. The voltage across the overall capacitance will vary in accordance with:

$$V(t) = V_o * \exp(-t/\tau) \tag{2}$$

Here, $V_o$ is the initial voltage, $\tau = R_1 * (C_s + C_{p1})$ and $R_1$ is the value of the feedback resistor 8. When $t = T/2$, $V(T/2) = V_1$ and $V_o = V_h$ the following will be valid for one half period:

$$T/2 = \tau * \ln\{(V_{cc} + V_n)/(V_{cc} - V_n)\} = \tau * \ln\{(1+\alpha)/(1-\alpha)\} \tag{3}$$

where $\alpha = V_n / V_{cc}$. For a small value of $\alpha$ equation (3) can be reduced to the following approximation:

$$T = 4 * \tau * \alpha = 4 * R_1 * (C_s + C_{p1}) * V_n / V_{cc} \tag{4}$$

The oscillation frequency $F_s$ is therefore approximately equal to:

$$F_s = V_{cc} / \{4 * V_n * R_1 * (C_s + C_{p1})\} \tag{5}$$

At the output 6 a squarewave voltage appears which charges and discharges the capacitors 28 and 30 via the series resistor 22. This results in a ripple voltage across the capacitors 28 and 30, whose peak-peak voltage $V_{pp}$ is approximately equal to:

$$V_{pp} = V_{cc} / \{4 * F_s * R_2 * (C_r + C_{p2})\} \tag{6}$$

If $R_2$ is now selected to be equal to $R_1$ and equation (5) is substituted in equation (6) it follows that:

$$V_{pp} = V_n * (C_s + C_{p1}) / (C_r + C_{p2}) \tag{7}$$

If now for the second inverting amplifier 26 a Schmitt trigger is used having the same voltage difference $V_n$ between the high and the low threshold voltage as for the first inverting amplifier 2 the following is achieved. $V_{pp}$ is smaller than $V_n$ if $C_s$ is smaller than $C_r$, so that the two trigger thresholds $V_n$ and $V_h$ of the second inverting amplifier 26 are not exceeded and a d.c. level appears on the output 32 of this amplifier. $V_{pp}$ is larger than $V_n$ if $C_s$ is larger than $C_r$, so that the two trigger thresholds $V_n$ and $V_h$ are exceeded periodically and an a.c. signal with the oscillation frequency $F_s$ appears on the output 32. The voltage difference $V_n$ is substantially equal for the inverting amplifiers 2 and 26 if the amplifiers are identical and are integrated on one semiconductor body. This has the additional advantage that the parasitic capacitors $C_{p1}$ and $C_{p2}$ are then also substantially equal and the influence of these parasitic capacitors on the amplitude of $V_{pp}$ is eliminated. The resistors 8 and 22 have equal values. A parasitic capacitance parallel to these resistors will then neither have any effect on the ripple voltage $V_{pp}$ because a strictly symmetrical load is seen from the output 6 to reference terminal 10.

Thus, it is achieved that the output 32 supplies an a.c. signal if $C_s$ is larger than $C_r$ and a d.c. signal if $C_s$ is smaller than $C_r$, inaccuracies as a result component spreads being largely eliminated owing to the symmetry of the circuit. Detection whether the output 32 carries an a.c. or a d.c. signal is possible by means of a comparator 34, which is also formed by an inverting Schmitt trigger and which has an input 36 and an output 38, which input 36 receives a signal from the output 32 of the second inverting amplifier 26 via a charge pump 40. The charge pump 40 comprises a first capacitor 42 connected between the output 32 and a node 44, a first diode 46, having its cathode connected to the node 44 and its anode to the reference terminal 10, a second diode 48, having its anode connected to the node 44 and its cathode to the input 36, and a resistor 50 and a capacitor 52, which are connected between the input 36 and the reference terminal 10.

The charging current i through the capacitor 42 per oscillation period $1/F$ is approximately equal to:

$$i = C_1 * (V_{cc} - 2 * V_j - V_2) * F = V_2 / R_3 \tag{8}$$

In this equation $C_1$ is the value of the capacitor 42, $V_j$ is the junction voltage of the diodes 46 and 48, $V_2$ is the voltage across the capacitor 52, and $R_3$ is the value of the resistor 50. If the threshold voltages of the comparator 34 lie approximately halfway the supply voltage $V_{cc}$ the voltage $V_2$ must be equal to $V_{cc}/2$ at the minimum frequency $F_1$ and the following equation is valid:

$$F_1 = V_{cc} / \{R_3 * C_1 * (V_{cc} - 4 * V_j)\} \tag{9}$$

As stated hereinbefore the oscillation frequency may be equal to the detected mains frequency. When $F_1 = 20$ Hz, $V_{cc} = 5$ V and $V_j = 0.7$ V it follows from equation (9) that the time constant $R_3 * C_1$ has a value of approximately 114 ms. The capacitor 52 provides some delay in the change-over of the comparator 34.

Figure 2:
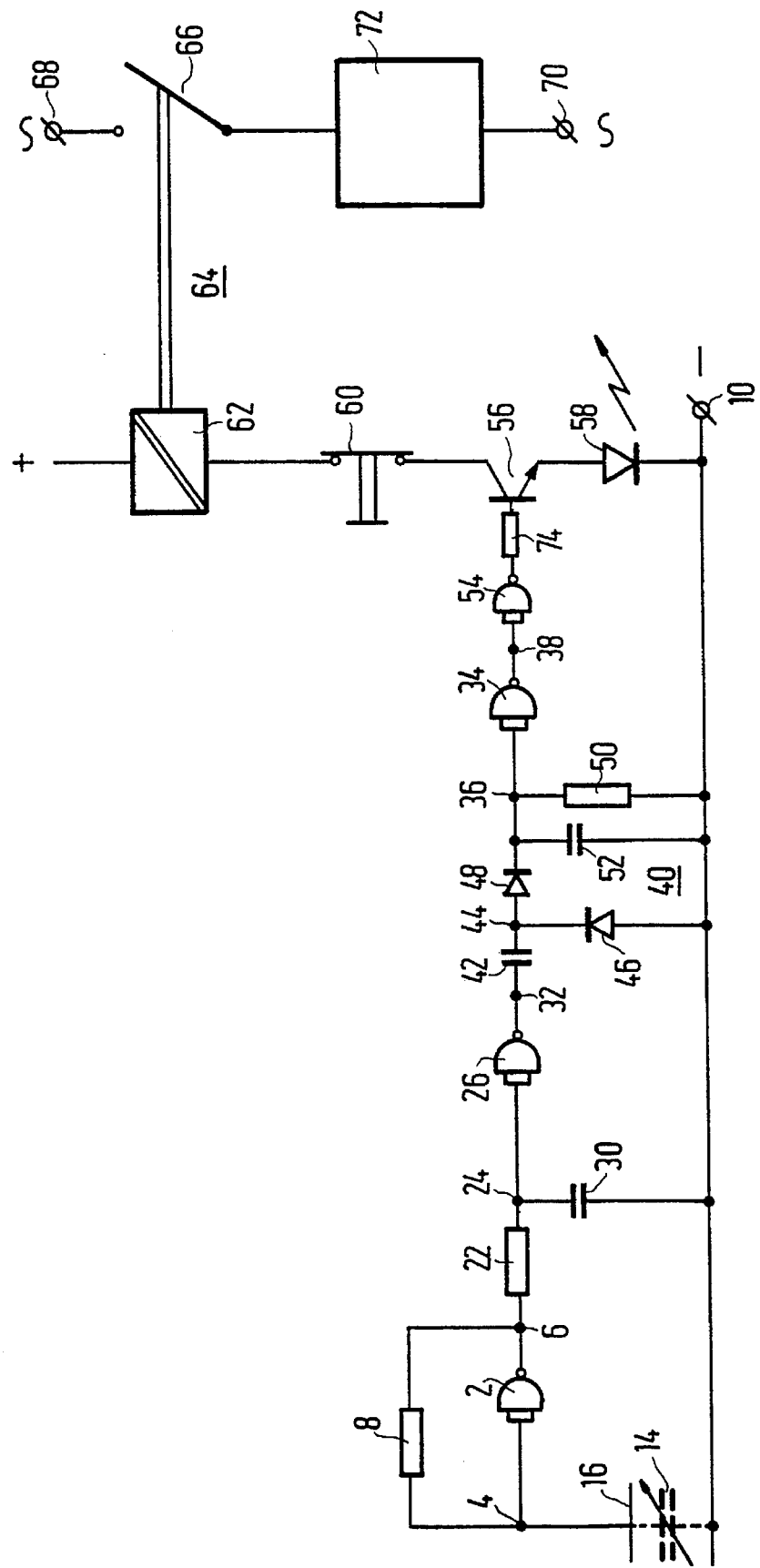
FIG. 2 shows a circuit diagram of an electrical apparatus comprising a capacitive sensor circuit in accordance with the invention.

FIG. 2 shows the capacitive sensor circuit of FIG. 1 used in an electrical apparatus. The inverters 2, 26 and 34 are implemented by means of dual input Schmitt trigger NANDs. The output 38 of the inverter 34 drives the base of an NPN switching transistor 56 via a fourth dual input Schmitt trigger NAND 54 and a current limiting resistor 74, the emitter of said switching transistor being connected to the reference terminal 10 via a light-emitting diode (LED) 58 and the collector of this transistor driving the energizing coil 62 of a relay 64 via an interrupter switch 60. The relay and the NANDs receive their supply voltage from a supply voltage source, not shown, which may comprise a rectifier circuit, not shown. The relay actuates a switch 66, which is arranged in series with a load 72 between mains voltage terminals 68 and 70. The load 72 may be, for example, a motor, a heating element, a lamp or any other device to be turned on and turned off.

At comparatively low oscillation frequencies, i.e. when the sensor electrode 16 is approached as in the case that the apparatus is taken hold of, an a.c. signal appears on the output 32, so that the input 36 is high. The output 38 is then low and the transistor 56 is turned on via the inverter 54. The energizing coil 62 of the relay 64 is energized, the switch 66 is closed and the load 72 receives mains voltage. By means of the interrupter switch 60 the power supply to the energizing coil 62 can be interrupted to render the electrical apparatus inoperative. The LED 58 signals that the load is connected to the mains via the switch 66. When the apparatus is put aside the oscillation frequency is comparatively high, the output 32 is then continually high and the input 36 is low, so that the output 38 is high and the transistor 56 receives no base current. Now the relay 64 is not energized, the LED 58 is turned off and the load 72 is disconnected from the mains voltage. Thus, the relay is energized in response to the a.c./d.c. signal on the output 32 of the second inverting amplifier 26.

The second amplifier 26 may alternatively be non-inverting because this is irrelevant for the decision whether an a.c. signal or a d.c. signal is present on the output 32. The value $C_r$ of the reference capacitor 30 depends on the envisaged values of the sensing capacitor 14.

Figure 3:
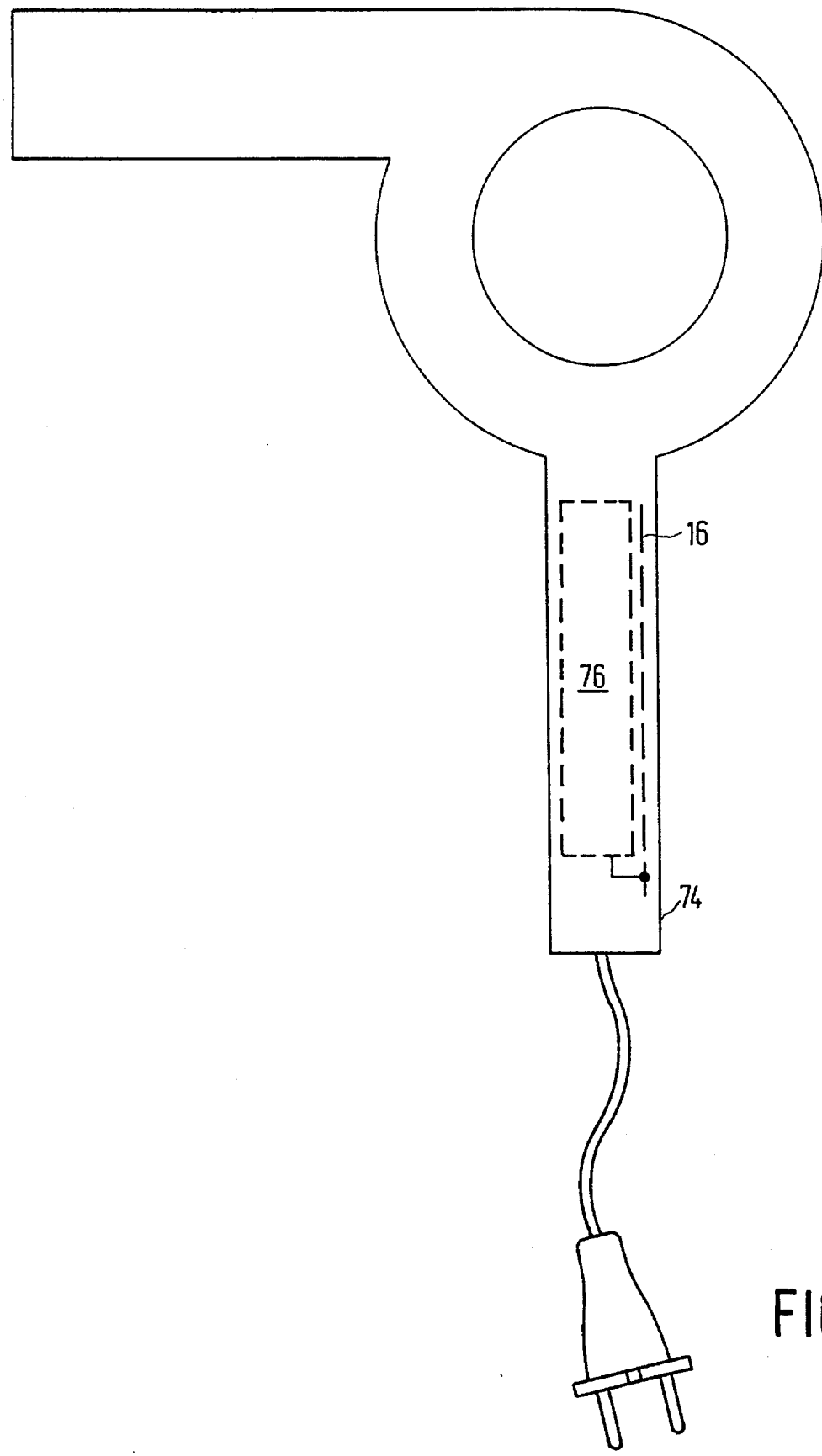
FIG. 3 shows a hair drier having a capacitive sensor circuit in accordance with the invention built into its handle.

FIG. 3 shows an electric hair drier having a handle 74, in which the sensor electrode 16 is mounted. The capacitive sensor circuit and the other electronic devices of FIG. 2 are accommodated on a p.c. board 76, which is also mounted in the handle 74.

I claim:

1. A capacitive sensor circuit comprising: a sensor electrode (16) forming a first plate of a sensing capacitor (14); a first inverting amplifier (2), having an input (4) connected to the sensor electrode (16) and having an output (6); a second amplifier (26), having an input (24) coupled to the output (6) of the first inverting amplifier (2) and having an output (32); a feedback resistor (8) connected between the output (6) and the input (4) of the first inverting amplifier (2), wherein a series resistor (22) is connected between the output (6) of the first inverting amplifier (2) and the input (24) of the second amplifier (26), which series resistor (22) has a resistance value substantially equal to the resistance value of the feedback resistor (8); a reference capacitor (30) is connected between the input (24) of the second amplifier (26) and a reference terminal (10), which reference capacitor (30) has a capacitance value substantially equal to a predetermined value of the capacitance of the capacitive sensor electrode (16) relative to the reference terminal (10); and wherein the first inverting amplifier (2) and the second amplifier (26) are constructed as Schmitt triggers having substantially the same low and high input threshold voltages.

2. A capacitive sensor circuit as claimed in claim 1, wherein the first amplifier (2) and the second amplifier (26) are identical NAND Schmitt triggers accommodated in one semiconductor body.

3. A capacitive sensor circuit as claimed in claim 1 or 2, characterized in that the capacitive sensor circuit further comprises: a comparator (34) having an input (36) and an output (38); and a charge pump (40) comprising a first capacitor (42) connected between the output (32) of the second amplifier (26) and a node (44), a first diode (46) connected between the node (44) and the reference terminal (10), a second diode (48) connected between the node (10) and the input (36) of the comparator (34), one (48) of said first (46) and second (48) diodes having its anode connected to the node (44) and the other one (46) of said first (46) and second (48) diodes having its cathode connected to said node (44), a resistor (50) and a second capacitor (52), both connected between the input (36) of the comparator (34) and the reference terminal (10).

4. A capacitive sensor circuit as claimed in claim 3, wherein the comparator (34) is a Schmitt trigger having threshold voltages which lie substantially halfway the supply voltage of the Schmitt trigger.

5. An electrical apparatus comprising a load (72) and a controllable switch (56, 62, 64, 66) having a main current path (66) arranged in series with the load (72) and having a main current path (56, 62) for receiving a control signal for turning on and turning off the controllable switch (56, 62, 64, 66) in response to a signal from the output (32) of the second amplifier (26) of a capacitive sensor circuit as claimed in claim 1.

6. An electrical apparatus as claimed in claim 5, wherein the electrical apparatus has a handle (74) which accommodates the sensor electrode (16).

7. A capacitive sensor as claimed in claim 2 wherein the capacitive sensor circuit further comprises: a comparator (34) having an input (36) and an output (38); and a charge pump (40) comprising a first capacitor (42) connected between the output (32) of the second amplifier (26) and a node (44), a first diode (46) connected between the node (44) and the reference terminal (10), a second diode (48) connected between the node (10) and the input (36) of the comparator (34), one (48) of said first (46) and second (48) diodes having its anode connected to the node (44) and the other one (46) of said first (46) and second (48) diodes having its cathode connected to said node (44), a resistor (50) and a second capacitor (52), both connected between the input (36) of the comparator (34) and the reference terminal (10).

8. An electrical apparatus comprising a load (72) and a controllable switch (56, 62, 64, 66) having a main current path (66) arranged in series with the load (72) and having a main current path (56, 62) for receiving a control signal for turning on and turning off the controllable switch (56, 62, 64, 66) in response to a signal from the output (32) of the second amplifier (26) of a capacitive sensor circuit as claimed in claim 2.

9. An electrical apparatus comprising a load (72) and a controllable switch (56, 62, 64, 66) having a main current path (66) arranged in series with the load (72) and having a main current path (56, 62) for receiving a control signal for turning on and turning off the controllable switch (56, 62, 64, 66) in response to a signal from the output (32) of the second amplifier (26) of a capacitive sensor circuit as claimed in claim 3.

10. An electrical apparatus comprising a load (72) and a controllable switch (56, 62, 64, 66) having a main current path (66) arranged in series with the load (72) and having a main current path (56, 62) for receiving a control signal for turning on and turning off the controllable switch (56, 62, 64, 66) in response to a signal from the output (32) of the second amplifier (26) of a capacitive sensor circuit as claimed in claim 4.

* * * * *